(12) United States Patent
Liu et al.

(10) Patent No.: US 11,552,263 B2
(45) Date of Patent: Jan. 10, 2023

(54) DISPLAY SUBSTRATE WITH ADHESION-ENHANCING LAYERS, MANUFACTURING METHOD THEREOF, AND DISPLAY DEVICE

(71) Applicant: BOE Technology Group Co., Ltd., Beijing (CN)

(72) Inventors: Lu Liu, Beijing (CN); Yunjin Liu, Beijing (CN); Weifeng Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 168 days.

(21) Appl. No.: 17/048,146

(22) PCT Filed: Mar. 13, 2020

(86) PCT No.: PCT/CN2020/079206
§ 371 (c)(1),
(2) Date: Oct. 16, 2020

(87) PCT Pub. No.: WO2020/187151
PCT Pub. Date: Sep. 24, 2020

(65) Prior Publication Data
US 2021/0167306 A1   Jun. 3, 2021

(30) Foreign Application Priority Data

Mar. 15, 2019   (CN) .......................... 201910196423.8

(51) Int. Cl.
*H01L 51/00* (2006.01)
*H01L 27/32* (2006.01)
*H01L 51/56* (2006.01)

(52) U.S. Cl.
CPC ...... *H01L 51/0097* (2013.01); *H01L 27/3276* (2013.01); *H01L 51/003* (2013.01);
(Continued)

(58) Field of Classification Search
None
See application file for complete search history.

(56) References Cited

U.S. PATENT DOCUMENTS

2014/0131668 A1   5/2014   Kim
2015/0137102 A1   5/2015   Yang
(Continued)

FOREIGN PATENT DOCUMENTS

CN   104950535 A   9/2015
CN   105826350 A   8/2016
(Continued)

OTHER PUBLICATIONS

International search report of PCT application No. PCT/CN2020/079206 dated Jun. 16, 2020.
(Continued)

*Primary Examiner* — J. E. Schoenholtz
(74) *Attorney, Agent, or Firm* — Fay Sharpe LLP (57) ABSTRACT

The display substrate includes: the flexible base substrate and the trace layer, a first adhesion-enhancing layer, and a first insulating layer that are stacked on the flexible base substrate, wherein the first adhesion-enhancing layer is between the first insulating layer and the trace layer, and the first adhesion-enhancing layer is bonded to the first insulating layer and the trace layer respectively. The flexible base substrate is provided with a bending area, and an overlapping area is present between an area which an orthographic projection of the first adhesion-enhancing layer on the flexible base substrate is within and the bending area, and an orthographic projection of the signal trace in the trace layer on the flexible base substrate falls in the bending area.

17 Claims, 5 Drawing Sheets

(52) U.S. Cl.
CPC ........ *H01L 51/56* (2013.01); *H01L 2227/323* (2013.01); *H01L 2227/326* (2013.01); *H01L 2251/5338* (2013.01)

(56) References Cited

U.S. PATENT DOCUMENTS

| | | | |
|---|---|---|---|
| 2015/0382457 A1 | 12/2015 | Tomita | |
| 2016/0218305 A1 | 7/2016 | Kim et al. | |
| 2018/0090698 A1* | 3/2018 | Jeong | H01L 51/003 |
| 2019/0165081 A1* | 5/2019 | Lee | H01L 27/3262 |
| 2019/0287433 A1 | 9/2019 | Huang et al. | |
| 2020/0006680 A1* | 1/2020 | Fang | H01L 27/3244 |
| 2020/0089368 A1* | 3/2020 | Shim | H01L 27/323 |
| 2020/0161572 A1 | 5/2020 | Zheng et al. | |
| 2021/0280828 A1* | 9/2021 | Kim | H01L 27/3276 |
| 2022/0149131 A1* | 5/2022 | Lee | H01L 27/3258 |

FOREIGN PATENT DOCUMENTS

| | | |
|---|---|---|
| CN | 106530973 A | 3/2017 |
| CN | 106920829 A | 7/2017 |
| CN | 106972030 A | 7/2017 |
| CN | 107134538 A | 9/2017 |
| CN | 107818990 A | 3/2018 |
| CN | 207676908 U | 7/2018 |
| CN | 108470762 A | 8/2018 |
| CN | 109256400 A | 1/2019 |
| CN | 109411513 A | 3/2019 |
| CN | 109411525 A | 3/2019 |
| CN | 109887416 A | 6/2019 |
| EP | 2731155 A3 | 5/2016 |
| KR | 20140086639 A | 7/2014 |

OTHER PUBLICATIONS

First office action of Chinese application No. 201910196423.8 dated Sep. 1, 2020.

* cited by examiner

DISPLAY SUBSTRATE WITH ADHESION-ENHANCING LAYERS, MANUFACTURING METHOD THEREOF, AND DISPLAY DEVICE

The application is a 371 of PCT Application No. PCT/CN2020/079206, filed on Mar. 13, 2020, which claims priority to Chinese Patent Application No. 201910196423.8, filed on Mar. 15, 2019 and entitled "FLEXIBLE DISPLAY SUBSTRATE, MANUFACTURING METHOD THEREOF, AND DISPLAY DEVICE", the entire contents of which are incorporated herein by reference.

TECHNICAL FIELD

The present disclosure relates to the technical field of display, and more particularly to a display substrate, a manufacturing method thereof, and a display device.

BACKGROUND

With the development of the display technology, display devices are gradually developed into flexible display devices.

A display device includes a display substrate which may have a bending area, wherein the bending area of the display substrate may be bent to achieve various purposes.

SUMMARY

Embodiments of the present disclosure provide a display substrate, a manufacturing method thereof, and a display device, and the technical solutions are as follows.

In one aspect, a display substrate is provided. The display substrate includes a flexible base substrate, and a trace layer, a first adhesion-enhancing layer, and a first insulating layer that are stacked on the flexible base substrate, wherein the first adhesion-enhancing layer is between the first insulating layer and the trace layer, and the first adhesion-enhancing layer is bonded to the first insulating layer and the trace layer respectively;

the flexible base substrate is provided with a bending area, and an overlapping area is present between an area which an orthographic projection of the first adhesion-enhancing layer on the flexible base substrate is within and the bending area; and the trace layer is provided with a signal trace, and an overlapping area is present between an area which an orthographic projection of the signal trace on the flexible base substrate is within and the bending area.

Optionally, a material of the first adhesion-enhancing layer includes one or more of an acrylic resin, an epoxy resin, and a polyimide.

Optionally, a thickness of the first adhesion-enhancing layer is in a range of 1 micron to 3 microns.

Optionally, the display substrate includes a second adhesion-enhancing layer and a second insulating layer that are stacked on the flexible base substrate, wherein the second insulating layer is on one side of the trace layer distal from the first insulating layer, the second adhesion-enhancing layer is between the second insulating layer and the trace layer, the second adhesion-enhancing layer is bonded to the second insulating layer and the trace layer respectively, and an overlapping area is present between an area which an orthographic projection of the second adhesion-enhancing layer on the flexible base substrate is within and the bending area.

Optionally, a material of the second adhesion-enhancing layer includes one or more of an acrylic resin, an epoxy resin, and a polyimide.

Optionally, a thickness of the second adhesion-enhancing layer is in a range of 1 micron to 3 microns.

Optionally, the second insulating layer is on one side of the trace layer distal from the flexible base substrate; and the display substrate includes a stress balancing layer on one side of the second insulating layer distal from the flexible base substrate, and an overlapping area is present between an area which an orthographic projection of the stress balancing layer on the flexible base substrate is within and the bending area.

Optionally, the trace layer includes a source trace and a drain trace.

Optionally, the first insulating layer is an organic layer.

Optionally, the second insulating layer is an organic layer.

Optionally, the display substrate includes a second adhesion-enhancing layer and a second insulating layer that are stacked on the flexible base substrate, wherein the second insulating layer is on one side of the trace layer distal from the first insulating layer, the second adhesion-enhancing layer is between the second insulating layer and the trace layer, the second adhesion-enhancing layer is bonded to the second insulating layer and the trace layer respectively, and an overlapping area is present between an area which an orthographic projection of the second adhesion-enhancing layer on the flexible base substrate is within and the bending area;

a material of the first adhesion-enhancing layer or a material of the second adhesion-enhancing layer includes one or more of an acrylic resin, an epoxy resin, and a polyimide; and a thickness of the first adhesion-enhancing layer or a thickness of the second adhesion-enhancing layer is in a range of 1 micron to 3 microns.

In another aspect, a manufacturing method of a display substrate is provided, the method including:

obtaining a flexible base substrate provided with a bending area; and forming a trace layer, a first adhesion-enhancing layer, and a first insulating layer that are stacked on the flexible base substrate, wherein the first adhesion-enhancing layer is bonded to the first insulating layer and the trace layer respectively, an overlapping area is present between an area which an orthographic projection of the first adhesion-enhancing layer on the flexible base substrate is within and the bending area, and an overlapping area is present between an area which an orthographic projection of the signal trace in the trace layer on the flexible base substrate is within and the bending area.

Optionally, after forming the trace layer, the first adhesion-enhancing layer, and the first insulating layer that are stacked on the flexible base substrate, the method further includes:

forming a second adhesion-enhancing layer and a second insulating layer that are stacked on the flexible base substrate on which the trace layer is formed, wherein the second insulating layer is bonded to the second insulating layer and the trace layer respectively, and an overlapping area is present between an area which an orthographic projection of the second adhesion-enhancing layer on the flexible base substrate is within and the bending area.

Optionally, forming the trace layer, the first adhesion-enhancing layer, and the first insulating layer that are stacked on the flexible base substrate includes:

forming the first insulating layer, the first adhesion-enhancing layer, and the trace layer in sequence on the flexible base substrate.

Optionally, forming the first insulating layer, the first adhesion-enhancing layer, and the trace layer in sequence on the flexible base substrate includes:

coating a polyimide solution on the flexible base substrate, and performing a drying process to the polyimide solution to form the first insulating layer;

forming, by deposition, coating or sputtering, an acrylic resin layer on the flexible base substrate on which the first insulating layer is formed;

processing the acrylic resin layer by patterning to obtain the first adhesion-enhancing layer;

forming, by deposition, coating or sputtering, a metal material layer on the flexible base substrate on which the first adhesion-enhancing layer is formed; and processing the metal material layer by patterning to obtain the trace layer.

Optionally, after forming the second adhesion-enhancing layer and the second insulating layer that are stacked on the flexible base substrate on which the trace layer is formed, the method further includes:

forming a stress balancing layer on the flexible base substrate on which the second insulating layer is formed, wherein an overlapping area is present between an area which an orthographic projection of the stress balancing layer on the flexible base substrate is within and the bending area.

Optionally, obtaining the flexible base substrate provided with the bending area includes:

providing a rigid base substrate; and forming the flexible base substrate provided with the bending area on the rigid base substrate.

In yet another aspect, a display device is provided, the display device including any of the aforementioned display substrates.

It should be understood that the above general description and the following detailed description are exemplary only, and cannot limit the present disclosure.

BRIEF DESCRIPTION OF THE DRAWINGS

In order to describe the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may also derive other drawings from these accompanying drawings without creative efforts.

The drawings herein are incorporated into the description and constitute a part of the description, show embodiments that are consistent with the present disclosure, and are used together with the description to explain the principles of the present disclosure.

DETAILED DESCRIPTION

The present disclosure is described below in combination with the accompanying drawings. Apparently, the described embodiments are merely some embodiments, rather than all embodiments, of the present disclosure. Based on the embodiments of the present disclosure, all other embodiments derived by a person of ordinary skill in the art without creative efforts shall fall within the protection scope of the present disclosure.

Display substrate is known for its thin thickness and bendable performance. The display substrate is provided with a display surface and a non-display surface that are opposite. The display surface is provided with a display area and a non-display area. The non-display area usually includes a bonding area which is configured to bond an integrated circuit (IC) to the display substrate. Usually, the bonding area may be bent to a side where the non-display surface is arranged to realize a narrow frame or even no frame of the display device.

However, the display substrate usually includes a plurality of stacked film layers, the plurality of film layers include a trace layer, and the plurality of film layers are disposed in the bending area. In the process of bending the bonding area to the side where the non-display surface is disposed, the part of the plurality of film layers arranged in the bending area is prone to separation of film layers. Moreover, with the progress of the bending process, the separation gradually spreads and finally causes cracks in the film layers (the cracks may be observed with a microscope). In the process of performing a reliability test to the display substrate, the crack usually expands and extends to the trace layer, which causes the signal trace of the trace layer to break; in addition, the signal trace in the bending area is prone to fatigue, which also causes the signal trace to break, and then causes poor process of the display substrate. The signal trace of the trace layer usually includes a source trace and a drain trace (referred to as a source and drain trace, also known as an SD line or a data line). When the source and drain trace breaks, the display substrate is prone to having bright lines in the extending direction of the source and drain trace during display, which causes poor display and affects the display effect.

The above reliability test may be a high temperature and high humidity test, and the specifications of the test may be 69° C. (degrees Celsius), 90% (percent) in relative humidity (RH) and 500 hours (hrs). Exemplarily, the display substrate may be placed in an environment with a temperature of 69°

C. and a relative humidity of 90% for 500 hrs. During this process, the test shows whether the display substrate is defective or not.

An embodiment of the present disclosure provides a display substrate, a manufacturing method thereof, and a display device. In the display substrate, an adhesion-enhancing layer is provided between a trace layer and an insulating layer to bond respectively with the trace layer and the insulating layer. The adhesion-enhancing layer overlaps with a bending area of the display substrate. The adhesion-enhancing layer may enhance the adhesion between the trace layer and the insulating layer, and reduce the possibility of breaking of the signal trace of the trace layer caused by separation of film layers between the trace layer and the insulating layer, thereby reducing the probability of poor process of the display substrate. At the same time, the adhesion-enhancing layer can reduce the stress of the signal trace and reduce the possibility of breaking of the signal trace caused by excessive stress. For the detailed solution of the present disclosure, reference is made to the description of the following embodiments.

Figure 1:
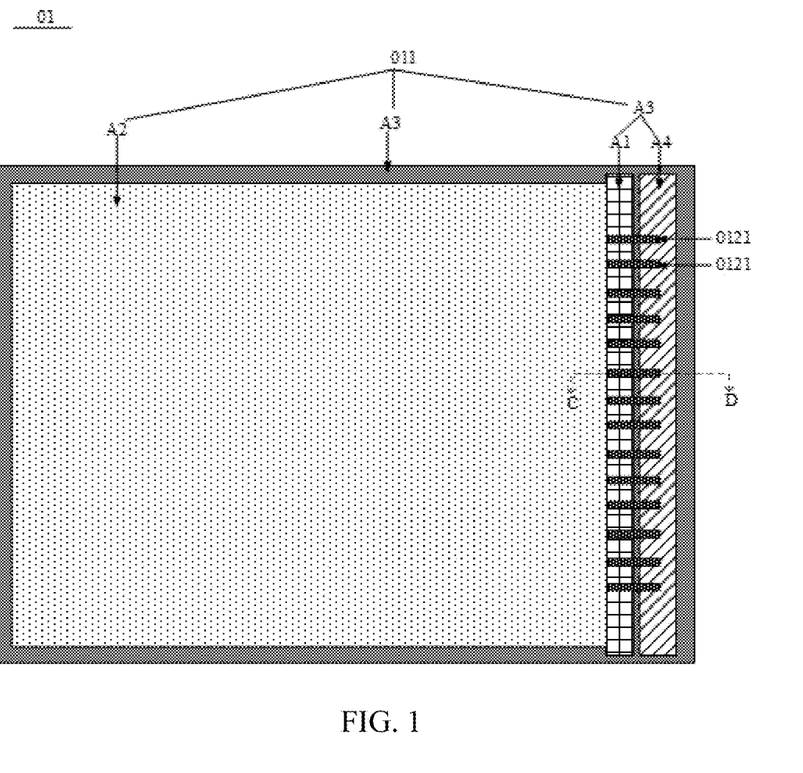
FIG. 1 is a front view of a display substrate according to an embodiment of the present disclosure.
Figure 2:
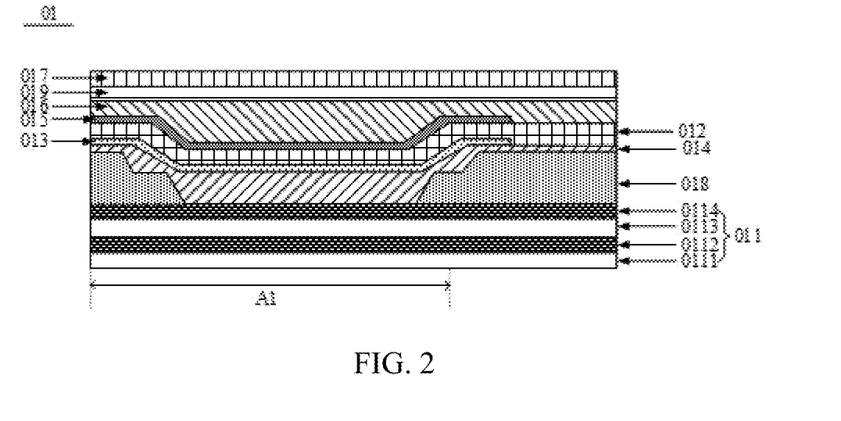
FIG. 2 is a schematic cross-sectional view of the part C-D of the display substrate according to an embodiment of the present disclosure.

FIG. 1 is a front view of a display substrate 01 according to an embodiment of the present disclosure, and FIG. 2 is a schematic cross-sectional view of the part C-D of the display substrate 01 shown in FIG. 1. With reference to FIGS. 1 and 2, the display substrate 01 includes: a flexible base substrate 011 and a trace layer 012 (not shown in FIG. 1), a first adhesion-enhancing layer 013 (not shown in FIG. 1), and a first insulating layer 014 (not shown in FIG. 1) that are stacked on the flexible base substrate 011. The first insulating layer 014 is disposed on one side of the trace layer 12, the first adhesion-enhancing layer 013 is disposed between the first insulating layer 014 and the trace layer 012, and the first adhesion-enhancing layer 013 is bonded to the first insulating layer 014 and the trace layer 012 respectively.

The flexible base substrate 011 is provided with a bending area A1, and an orthographic projection of the first adhesion-enhancing layer 013 on the flexible base substrate 011 at least falls in the bending area A1. An overlapping area is present between an area which an orthographic projection of a signal trace 0121 (not shown in FIG.2) in the trace layer 012 on the flexible base substrate 011 is within and the bending area A1 (that is, the orthographic projection of the signal trace on the flexible base substrate includes a part in the bending area, or a part outside the bending area). The first adhesion-enhancing layer 013 is configured to enhance the adhesion between the trace layer 012 and the first insulating layer 014.

In summary, a display substrate is provided according to the embodiments of the present disclosure. In the flexible base substrate, a first adhesion-enhancing layer is provided between the trace layer and the first insulating layer. The first adhesion-enhancing layer is bonded to the trace layer and the first insulating layer respectively, and an overlapping area is present between the area which the orthographic projection of the first adhesion-enhancing layer on the flexible base substrate is within and the bending area. The first adhesion-enhancing layer may enhance the adhesion between the trace layer and the first insulating layer, and reduce the possibility of breaking of the signal trace of the trace layer caused by separation of film layers between the trace layer and the first insulating layer, thereby reducing the probability of poor process of the display substrate.

Optionally, as shown in FIG. 1, the flexible base substrate 011 is provided with a display area A2 and a non-display area A3. The non-display area A3 includes a bending area A1 and a bonding area A4. The bending area A1 is disposed between the display area A2 and the bonding area A4.

Optionally, with continuing reference to FIGS. 1 and 2, the display substrate 01 includes a second adhesion-enhancing layer 015 and a second insulating layer 016 that are stacked on the flexible base substrate 011. The second insulating layer 016 is disposed on one side of the trace layer 012 distal from the first insulating layer 014. The second adhesion-enhancing layer 015 is disposed between the second insulating layer 016 and the trace layer 012, and the second adhesion-enhancing layer 015 is bonded to the second insulating layer 016 and the trace layer 012 respectively. An overlapping area is present between an area which an orthographic projection of the second adhesion-enhancing layer on the flexible base substrate 011 is within and the bending area A1. The second adhesion-enhancing layer 015 is configured to enhance the adhesion between the trace layer 012 and the second insulating layer 016, and reduce the possibility of breakage of the signal trace of the trace layer 012 caused by separation of film layers between the trace layer 012 and the second insulating layer 016, thereby reducing the probability of poor process of the display substrate 011.

Optionally, in the embodiment of the present disclosure, a material of the first adhesion-enhancing layer 013 or a material of the second adhesion-enhancing layer 015 includes one or more of an acrylic resin, an epoxy resin, and a polyimide (PI). These materials have great adhesion to the trace layer 012 and the insulating layer. A thickness of the first adhesion-enhancing layer 013 or a thickness of the second adhesion-enhancing layer 015 is in a range of 1 micron to 3 microns. In this way, the first adhesion-enhancing layer 013 may be better bonded to the first insulating layer 014 and the trace layer 012, and the second adhesion-enhancing layer 015 may be better bonded to the second insulating layer 016 and the trace layer 012, so as to enhance the adhesion of the adhesion-enhancing layer to the trace layer 012 and the insulating layer. Exemplarily, the thickness of the first adhesion-enhancing layer 013 may be 1 micron, 1.5 microns or 3 microns, and the thickness of the second adhesion-enhancing layer 015 may be 1 micron, 2 microns, 3 microns, or the like, which is not limited in the embodiments of the present disclosure.

Optionally, as shown in FIG. 2, the first insulating layer 014 is disposed on one side of the trace layer 012 proximal to the flexible base substrate 011, and the second insulating layer 016 is disposed on one side of the trace layer 012 distal from the flexible base substrate 011.

The display substrate 01 further includes: a stress balancing layer 017 arranged on one side of the second insulating layer 016 distal from the flexible base substrate 011. An overlapping area is present between an area which an orthographic projection of the stress balancing layer 017 on the flexible base substrate 011 is within and the bending area A1. The stress balancing layer 017 may balance the stresses among various film layers in the area where the orthographic projection on the flexible base substrate 011 overlaps with the bending area A1, such that the stress of each of the film layers in the bending area A1 is balanced. In the process of bending the display substrate 01, the stress of the signal trace in the bending area of the display substrate 01 is small, which may reduce the possibility of breakage of the signal trace.

Optionally, with continuing reference to FIG. 2, the display substrate 01 further includes: a third insulating layer 018 disposed between the flexible base substrate 011 and the first insulating layer 014. The third insulating layer 018 is provided with a bending hole (not shown in FIG. 2), an orthographic projection of the bending hole on the flexible base substrate 011 covers the bending area A1 of the flexible base substrate 011, and the first insulating layer 014 is disposed in the bending hole.

Optionally, the orthographic projection of the bending hole on the flexible base substrate 011 coincides with the bending area A1 of the flexible base substrate 011. The first insulating layer 014 may be an organic filling layer, and the third insulating layer 018 may be an inorganic layer. The bending hole is arranged on the third insulating layer 018, and the orthographic projection of the bending hole on the flexible base substrate 011 covers the bending area A1 of the flexible base substrate 011. In this way, the thickness of the inorganic layer in the bending area of the display substrate 01 is small, which is conducive to bending the display substrate 01. The bending area of the display substrate 01 is also the corresponding area of the bending area A1 of the flexible base substrate 011 in the display substrate 01.

Optionally, in the embodiment of the present disclosure, the third insulating layer 018 may be a composite film layer including a plurality of insulating film layers, and the plurality of insulating film layers may all be inorganic layers. Exemplarily, materials of the plurality of insulating film layers may include at least one of a silicon oxide (SiOx) and a silicon nitride (SiNx). Optionally, the plurality of insulating film layers may include a buffer layer (not shown in FIG. 2), a gate insulating layer (not shown in FIG. 2), and an interlayer dielectric layer (not shown in FIG. 2); accordingly, the display substrate 01 further includes: an active layer (not shown in FIG. 2) disposed between the buffer layer and the gate insulating layer, a gate (not shown in FIG. 2) disposed between the gate insulating layer and the interlayer dielectric layer, and the source and drain layer disposed on one side of the interlayer dielectric layer distal from the gate insulating layer. The source and drain layer includes a source electrode and a drain electrode. The third insulating layer 018 may be composed of a part which extends from the buffer layer, the gate insulating layer, and the interlayer dielectric layer to the non-display area of the display substrate 01. The trace layer 012 may include a source and drain trace, and the source and drain trace may be connected to the source electrode. In the embodiment of the present disclosure, the first adhesion-enhancing layer 013 and the second adhesion-enhancing layer 015 are arranged to reduce the possibility of breakage of the source and drain trace, thereby reducing the probability of light lines along the extending direction of the source and drain trace appearing on the display substrate and affecting the display effect.

Optionally, the display substrate 01 according to the embodiment of the present disclosure may be an organic light-emitting diode (OLED) display substrate, and the second insulating layer 016 may be a flat layer which may be configured to improve the flatness of the flexible base substrate and facilitate for subsequent arrangement of the film layers. As shown in FIG. 2, the display substrate 01 further includes: an anode (not shown in FIG. 2), a pixel definition layer (PDL) 019, a light-emitting layer (not shown in FIG. 2), and a cathode (not shown in FIG. 2) that are arranged in sequence on one side of the second insulating layer 016 distal from the flexible base substrate 011. The light-emitting layer may be an OLED unit which is composed of the organic light-emitting layer, the anode, the light-emitting layer, and the cathode. Materials of the second insulating layer 016 and the pixel define layer 019 may be an organic resin, materials of the anode and the cathode may be an indium tin oxide (ITO), and a material of the light-emitting layer may include an organic light-emitting material, which is not repeated in the embodiments of the present disclosure.

Optionally, in the embodiment of the present disclosure, the flexible base substrate 011 may be composed of the inorganic layer and the flexible base layer that are alternately superimposed. The inorganic layer may be made of silicon nitride, silicon oxide, silicon oxynitride, or the like. The flexible base layer may be made of polyimide. Exemplarily, as shown in FIG. 2, the flexible base substrate 011 includes a first inorganic layer 0111, a first flexible substrate layer 0112, a second inorganic layer 0113, and a second flexible substrate layer 0114 that are superimposed in sequence.

FIGS. 1 and 2 only show the structures in the display substrate 01 which are related to the present disclosure. Those skilled in the art can easily understand that the display substrate further includes other structures such as an encapsulation layer, which is not repeated in the embodiments of the present disclosure.

In summary, the display substrate is provided according to the embodiments of the present disclosure. In the flexible base substrate, the first adhesion-enhancing layer is arranged between the trace layer and the first insulating layer, the first adhesion-enhancing layer is bonded to the trace layer and the first insulating layer respectively, and the overlapping area is present between the area which the orthographic projection of the first adhesion-enhancing layer on the flexible base substrate is within and the bending area. The first adhesion-enhancing layer can enhance the adhesion between the trace layer and the first insulating layer, and reduce the possibility of breaking of the signal trace of the trace layer caused by separation of film layers between the trace layer and the first insulating layer, thereby reducing the probability of poor process of the display substrate.

Optionally, a second adhesion-enhancing layer is arranged between the trace layer and the second insulating layer. The second insulating layer is bonded to the trace layer and the insulating layer respectively. An overlapping area is present between the area which the orthographic projection of the second adhesion-enhancing layer on the flexible base substrate is within and the bending area. The second adhesion-enhancing layer can enhance the adhesion between the trace layer and the second insulating layer, and reduce the possibility of breaking of the signal trace of the trace layer caused by separation of film layers between the trace layer and the second insulating layer, thereby reducing the probability of poor process of the display substrate.

The trace layer may include a source and drain trace. The solution provided in the embodiment of the present application can reduce the possibility of breaking of the source and drain trace, thereby reducing the probability of light lines along the extending direction of the source and drain trace appearing on the display substrate during display and improving the display effect of the display substrate.

The following method may be applicable to the display substrate according to the embodiment of the present disclosure. For the manufacturing method and manufacturing principle of the display substrate in the embodiment of the present disclosure can be referred to the description in the following embodiments.

Figure 3:
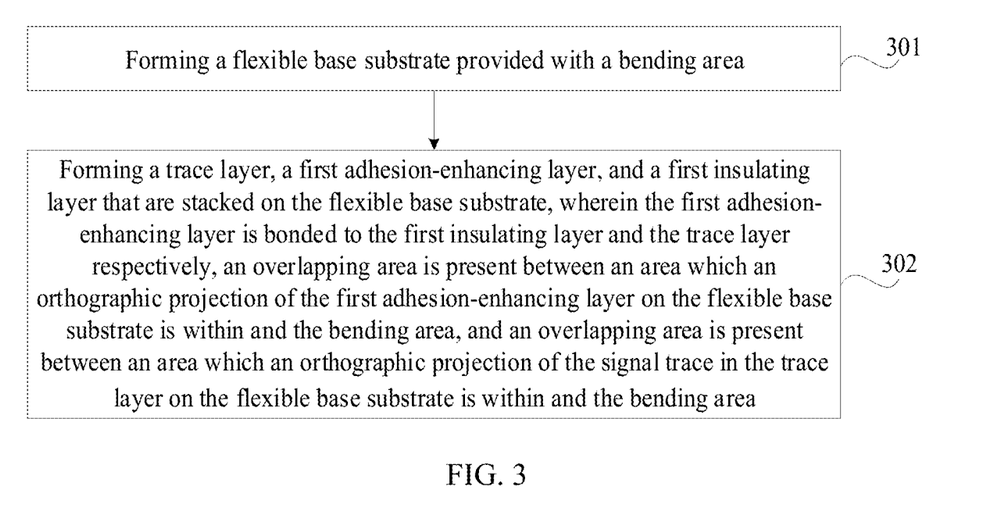
FIG. 3 is a flowchart of a manufacturing method of a display substrate according to an embodiment of the present disclosure.

FIG. 3 shows a flowchart of a manufacturing method of a display substrate according to an embodiment of the present disclosure. The method can be used for manufacturing the display substrate 01 according to the aforementioned embodiments. With reference to FIG. 3, the method includes the following steps:

In step 301, a flexible base substrate provided with a bending area is formed.

In step 302, a trace layer, a first adhesion-enhancing layer, and a first insulating layer that are stacked on the flexible base substrate are formed, wherein the first adhesion-enhancing layer is bonded to the first insulating layer and the trace layer respectively, an overlapping area is present between an area which an orthographic projection of the first adhesion-enhancing layer on the flexible base substrate is within and the bending area, and an overlapping area is present between an area which an orthographic projection of the signal trace in the trace layer on the flexible base substrate is within and the bending area.

The first adhesion-enhancing layer is configured to enhance the adhesion between the trace layer and the insulating layer.

In summary, the method of manufacturing the display substrate is provided in the embodiments of the present disclosure. In the flexible base substrate, the first adhesion-enhancing layer is arranged between the trace layer and the first insulating layer, the first adhesion-enhancing layer is bonded to the trace layer and the first insulating layer respectively, and the overlapping area is present between the area which the orthographic projection of the first adhesion-enhancing layer on the flexible base substrate is within and the bending area. The first adhesion-enhancing layer can enhance the adhesion between the trace layer and the first insulating layer, and reduce the possibility of breaking of the signal trace of the trace layer caused by separation of film layers between the trace layer and the first insulating layer, thereby reducing the probability of poor process of the display substrate.

Optionally, after step 302, the method further includes: forming a second adhesion-enhancing layer and a second insulating layer that are stacked on the flexible base substrate on which the trace layer is formed, wherein the second adhesion-enhancing layer is bonded to the second insulating layer and the trace layer respectively, an orthographic projection of the second adhesion-enhancing layer on the flexible base substrate at least falls in the bending area, and the second adhesion-enhancing layer is configured to enhance the adhesion between the trace layer and the second insulating layer. The second adhesion-enhancing layer may be formed at first and then the second insulating layer is formed, or the second insulating layer may be formed at first and then the second adhesion-enhancing layer is formed.

Optionally, a material of the first adhesion-enhancing layer or a material of the second adhesion-enhancing layer include one or more of an acrylic resin, an epoxy resin, and a polyimide.

Optionally, a thickness of the first adhesion-enhancing layer or a thickness of the second adhesion-enhancing layer is in a range of 1 micron to 3 microns.

Optionally, after forming the second adhesion-enhancing layer and the second insulating layer that are stacked on a flexible base substrate on which a trace layer is formed, the method further includes: forming a stress balancing layer on the flexible base substrate on which the second insulating layer is formed, wherein an overlapping area is present between an area which an orthographic projection of the stress balancing layer on the flexible base substrate is within and the bending area.

Optionally, the trace layer includes a source and drain trace, and both the first insulating layer and the second insulating layer are organic layers.

Optionally, the first insulating layer is an organic filling layer. After step 301, the method further includes: forming a third insulating layer on the flexible base substrate, wherein the third insulating layer is provided with a bending hole, an orthographic projection of the bending hole on the flexible base substrate covers the bending area, and the first insulating layer is disposed in the bending hole.

Optionally, the second insulating layer is a flat layer. Prior to forming the stress balance layer on the flexible base substrate on which the second insulating layer is formed, the method further includes: forming an anode, a pixel define layer, a light-emitting layer, and a cathode in sequence on the flexible base substrate on which the flat layer is formed.

Accordingly, forming the stress balancing layer on the flexible base substrate on which the second insulating layer is formed includes: forming a stress balancing layer on the flexible base substrate on which the cathode is formed.

Any combination of the aforementioned optional technical solutions may be adopted to form an optional embodiment of the present disclosure, which is not repeated herein.

Figure 4:
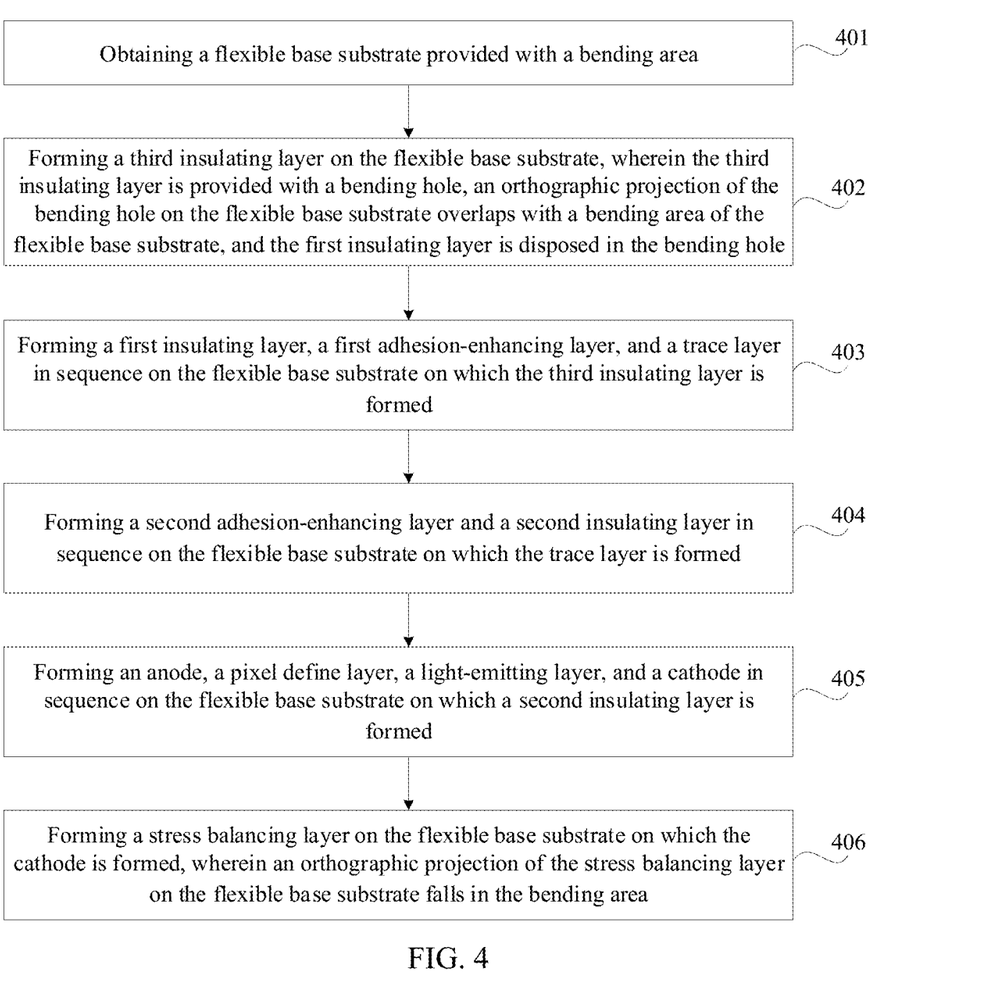
FIG. 4 is a flowchart of a manufacturing method of another display substrate according to an embodiment of the present disclosure.

FIG. 4 shows a flowchart of a manufacturing method of another display substrate according to the embodiment of the present disclosure, and the method may be used to manufacture the display substrate 01 according to the aforementioned embodiment. With reference to FIG. 4, the method includes the following steps.

In step 401, a flexible base substrate provided with a bending area is obtained.

In the embodiment of the present disclosure, the flexible base substrate may be directly obtained, or be manufactured. Optionally, the process of manufacturing the flexible base substrate may include: providing a rigid base substrate at first, and then forming the flexible base substrate on the rigid base substrate. The rigid base substrate may be a substrate made of a material with certain firmness such as glass, quartz or transparent resin. For example, the rigid base substrate is a glass substrate.

Optionally, the flexible base substrate may include an inorganic layer and a flexible base layer that are alternately superimposed. Therefore, forming the flexible base substrate on the rigid base substrate means forming the inorganic layer and the flexible substrate layer that are alternately superimposed on the rigid base substrate. A material of the flexible base layer include a PI, and a material of the inorganic layer may include a SiOx. Exemplarily, as shown in FIG. 2, the flexible base substrate 011 includes a first inorganic layer 0111, a first flexible substrate layer 0112, a second inorganic layer 0113, and a second flexible substrate layer 0114 that are superimposed in sequence. Therefore, forming the flexible base substrate 011 on the rigid base substrate may include the following four steps.

In step one, a layer of SiOx is formed on the rigid base substrate as the first inorganic layer 0111 by deposition, coating or sputtering.

In step two, a layer of PI solution is coated on the first inorganic layer 0111, and a drying process is performed to the PI solution to remove the solvent of the PI solution, such that the solute of the PI solution is retained as the first flexible substrate layer 0112.

In step three, a layer of SiOx is formed on one side of the first flexible substrate layer 0112 distal from the first inorganic layer 0111 by deposition, coating or sputtering.

In step four, a layer of PI solution is coated on the second inorganic layer 0113, and a drying process is performed to the PI solution to remove the solvent of the PI solution, such that the solute of the PI solution is retained as the second flexible substrate layer 0114.

In step 402, a third insulating layer is formed on the flexible base substrate, wherein the third insulating layer is provided with a bending hole, an orthographic projection of the bending hole on the flexible base substrate overlaps with the bending area, and the first insulating layer is disposed in the bending hole.

Figure 5:
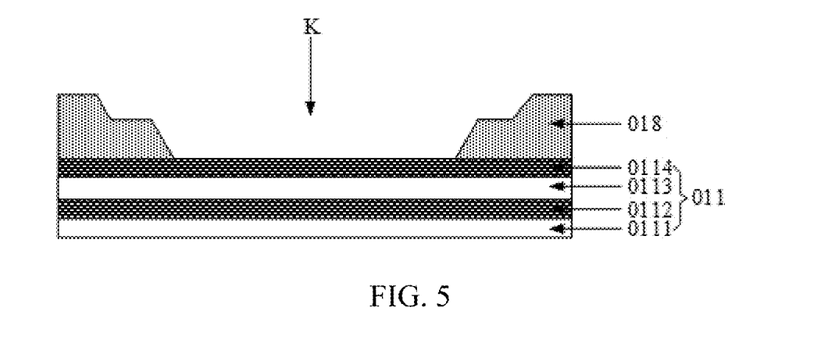
FIG. 5 is a schematic diagram after a third insulating layer is formed on a display substrate according to an embodiment of the present disclosure.

FIG. 5 shows a schematic diagram after a third insulating layer 018 is formed on the flexible base substrate 011 according to the embodiment of the present disclosure. The third insulating layer 018 is provided with a bending hole K, and an orthographic projection of the bending hole K on the flexible base substrate 011 covers the bending area (not shown in FIG. 5) of the flexible base substrate 011. The third insulating layer 018 includes a plurality of insulating film layers, and each of the plurality of insulating film layers may be an inorganic layer. For example, a material of the plurality of insulating film layers may include at least one of a SiOx and a SiNx.

Optionally, the plurality of insulating film layers in the third insulating layer may include a buffer layer, a gate insulating layer, and an interlayer dielectric layer. In addition, the display substrate further includes: an active layer disposed between the buffer layer and the gate insulating layer, a gate disposed between the gate insulating layer and the interlayer dielectric layer, and the source and drain layer disposed on one side of the interlayer dielectric layer distal from the gate insulating layer. The source and drain layer includes a source electrode and a drain electrode. The third insulating layer 018 may be composed of a part which is extended from the buffer layer, the gate insulating layer, and the interlayer dielectric layer to the non-display area of the display substrate. Therefore, forming the third insulating layer 018 on the flexible base substrate 011 may include: forming a buffer layer, an active layer, a gate insulating layer, a gate, an interlayer dielectric layer, and a source and drain layer in sequence on the flexible base substrate 011. The process of forming any one of the buffer layer, the gate insulating layer, and the interlayer dielectric layer may include: forming a SiOx material layer by deposition, coating or sputtering, and processing the SiOx material layer by patterning.

In step 403, the first insulating layer, the first adhesion-enhancing layer, and the trace layer are formed in sequence on the flexible base substrate on which the third insulating layer is formed.

Figure 6:
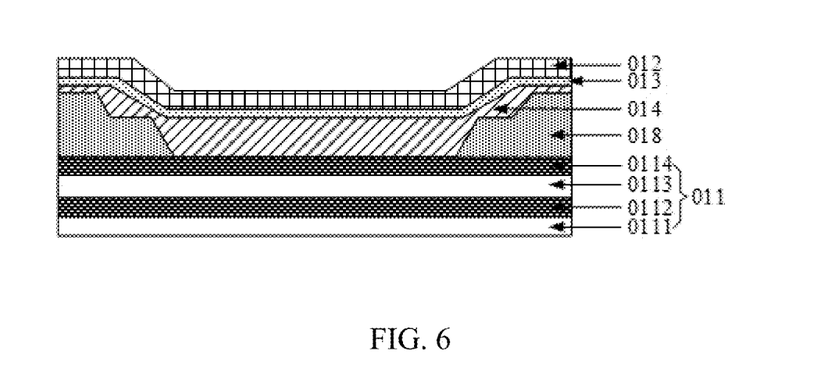
FIG. 6 is a schematic diagram after the first insulating layer, the first adhesion-enhancing layer, and the trace layer are formed in sequence on the flexible base substrate according to an embodiment of the present disclosure.

With reference to FIG. 6, it shows a schematic diagram after the first insulating layer 014, the first adhesion-enhancing layer 013, and the trace layer 012 are formed in sequence on the flexible base substrate 011 on which the third insulating layer 018 is formed, according to the embodiment of the present disclosure. In combination with FIGS. 5 and 6, the third insulation layer 018 is provided with a bending hole K. The first insulating layer 014 is disposed in the bending hole K, and the first insulation layer 014 may be an organic filling layer.

As shown in FIG. 6, the first adhesion-enhancing layer 013 is bonded to the first insulating layer 014 and the trace layer 012 respectively, and the orthographic projection of the first adhesion-enhancing layer 013 on the flexible base substrate 011 is at least within in the bending area (not shown in FIG. 6) of the flexible base substrate 011. The orthographic projection of the signal trace in the trace layer 012 on the flexible base substrate 011 falls in the bending area of the flexible base substrate 011. The first adhesion-enhancing layer 013 is used to enhance the adhesion between the trace layer 012 and the first insulating layer 014.

It may be known from step 402 that the orthographic projection of the bending hole K on the flexible base substrate 011 covers the bending area of the flexible base substrate 011. Because the overlapping area is present between the area which the orthographic projection of the first adhesion-enhancing layer 013 on the flexible base substrate 011 is within and the bending area of the flexible base substrate 011, and the overlapping area is present between the area which the orthographic projection of the signal trace in the trace layer 012 on the flexible base substrate 011 is within and the bending area of the flexible base substrate 011, the first adhesion-enhancing layer 013 is at least be disposed in the bending hole K, and the signal trace in the trace layer 012 is partially disposed in the bending hole K. The trace layer 012 may include a source and drain trace.

Optionally, a material of the trace layer 012 may include a conductive material such as a metal or an ITO, and a material of the first adhesion-enhancing layer 013 may include one or more of an acrylic resin, an epoxy resin, and a PI. A thickness of the first adhesion-enhancing layer 013 may be in a range of 1 micron to 3 microns, and a material of the first insulating layer 014 may include a PI.

Exemplarily, taking the case where the material of the trace layer 012 include a metal, the material of the first adhesion-enhancing layer 013 is an acrylic resin, and the material of the first insulating layer 014 is a PI as an example, the process of forming the first insulating layer 014, the first adhesion-enhancing layer 13, and the trace layer 012 in sequence on the flexible base substrate 011 on which the third insulating layer 018 is formed may include the following steps.

In step one, a layer of PI solution is coated on the flexible base substrate 011 on which the third insulating layer 018 is formed, and the PI solution is dried to remove the solvent of the PI solution, such that the solute of the PI solution is retained as the first insulating layer 014.

In step two, a layer of acrylic resin with a thickness ranging from 1 micron to 3 microns is formed, by deposition, coating or sputtering, on the flexible base substrate 011 on which the first insulating layer 014 is formed to obtain an acrylic resin layer, and the acrylic resin layer is processed by patterning to obtain the first adhesion-enhancing layer 013.

In step three, a layer of metal is formed, by deposition, coating or sputtering, on the flexible base substrate 011 on which the first adhesion-enhancing layer 013 is formed to obtain a metal material layer, and the metal material layer is processed by patterning to obtain the trace layer 012.

In step 404, a second adhesion-enhancing layer and a second insulating layer are formed in sequence on the flexible base substrate on which the trace layer is formed.

Figure 7:
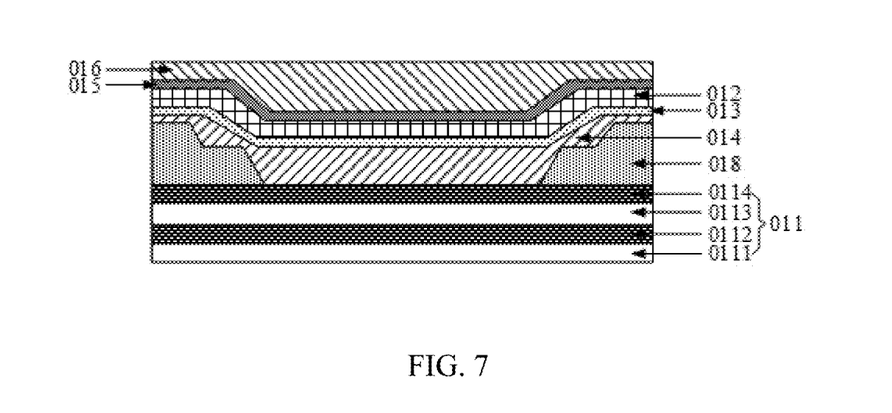
FIG.7 is a schematic diagram after a second adhesion-enhancing layer and a second insulating layer are formed in sequence on a flexible display substrate on which the trace layer is formed, according to an embodiment of the present disclosure.

FIG. 7 shows a schematic diagram after a second adhesion-enhancing layer 015 and a second insulating layer 016 are formed on a flexible base substrate 011 on which a trace layer 012 is formed, according to an embodiment of the present disclosure. The second insulating layer 016 may be a flat layer. The second adhesion-enhancing layer 015 is bonded to the second insulating layer 016 and the trace layer 012 respectively, and an overlapping area is present between an area which an orthographic projection of the second adhesion-enhancing layer 015 on the flexible base substrate 011 is within and the bending area (not shown in FIG. 7) of the flexible base substrate 011. It may be known from step 402 that the orthographic projection of the bending hole K on the flexible base substrate 011 covers the bending area of the flexible base substrate 011. Because the orthographic projection of the second adhesion-enhancing layer 015 on the flexible base substrate 011 at least falls in the bending area of the flexible base substrate 011, the second adhesion-enhancing layer 015 is at least disposed in the bending hole K.

Optionally, a material of the second adhesion-enhancing layer 015 may include one or more of an acrylic resin, an epoxy resin, and a PI. A thickness of the second adhesion-enhancing layer 015 is in a range of 1 micron to 3 microns, and a material of the second insulating layer 016 may include an organic resin.

Exemplarily, taking the case where the material of the second adhesion-enhancing layer 015 is an epoxy resin, and the material of the second insulating layer 016 is a SiNx as an example, forming the second adhesion-enhancing layer 015 and the second insulating layer 016 in sequence on the flexible base substrate 011 on which the trace layer 012 is formed may include the following steps.

In step one, a layer of epoxy resin with a thickness ranging from 1 micron to 3 microns is formed, by deposition, coating or sputtering, on the flexible base substrate 011 on which the trace layer 012 is formed to obtain an epoxy resin layer, and the epoxy resin layer is processed by patterning to obtain the second adhesion-enhancing layer 015.

In step two, a layer of organic resin is formed, by deposition, coating or sputtering, on the flexible base substrate 011 on which the second adhesion-enhancing layer 015 is formed to obtain an organic resin layer, and the organic resin layer is processed by patterning process to obtain the second insulating layer 016.

In step 405, an anode, a pixel define layer, a light-emitting layer, and a cathode are formed in sequence on the flexible base substrate on which a second insulating layer is formed.

Figure 8:
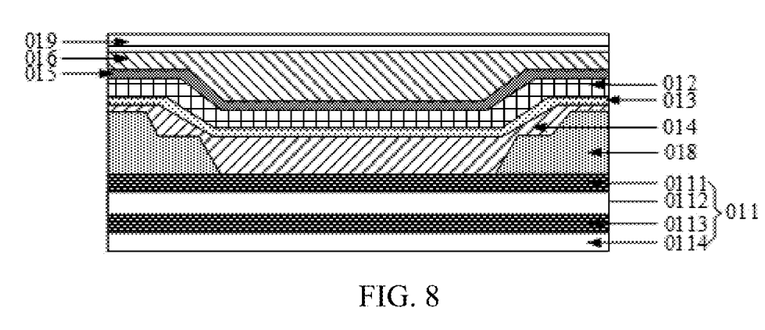
FIG. 8 is a schematic diagram after an anode, a pixel define layer, a light-emitting layer, and a cathode are formed in sequence on the flexible base substrate on which a second insulating layer is formed, according to an embodiment of the present disclosure.

FIG. 8 shows a schematic diagram after an anode (not shown in FIG. 8), a pixel define layer 019, a light-emitting layer (not shown in FIG. 8) and a cathode (not shown in FIG. 8) are formed in sequence on the flexible base substrate 011 on which the second insulating layer 016 is formed, according to an embodiment of the present disclosure. A material of the pixel define layer 019 may include an organic resin, materials of the anode and the cathode may include an ITO, and a material of the light-emitting layer may include an organic light-emitting material.

Exemplarily, forming the anode, the pixel define layer 019, the light-emitting layer, and the cathode in sequence on the flexible base substrate 011 on which a trace layer 016 is formed includes the following steps.

In step one, a layer of ITO is formed, by deposition, coating or sputtering, on the flexible base substrate 011 on which the second insulating layer 016 is formed to obtain an ITO material layer, and the IPO material layer is processed by patterning to obtain the anode.

In step two, a layer of organic resin is formed, by deposition, coating or sputtering, on the flexible base substrate 011 on which the anode is formed to obtain an organic resin layer, and the organic resin layer is processed by patterning to obtain the pixel define layer 019.

In step three, a layer of organic light-emitting material is formed, by deposition, coating or sputtering, on the flexible base substrate 011 on which the pixel define layer 019 is formed to obtain an organic light-emitting material layer, and the organic light-emitting material layer is processed by patterning to obtain a light-emitting layer.

In step four, a layer of ITO is formed, by deposition, coating or sputtering, as a cathode on the flexible base substrate 011 on which the anode is formed. Step four is illustrated by taking the cathode being a surface electrode (that is, the whole display substrate 01 is provided with a cathode) as an example. In the case that the cathode is a block electrode, the deposited ITO material layer may be processed patterning after the deposition of ITO, so as to obtain the cathode.

In step 406, a stress balancing layer is formed on the flexible base substrate on which the cathode is formed, wherein an orthographic projection of the stress balancing layer on the flexible base substrate falls in the bending area.

For the schematic diagram after the stress balancing layer 017 is formed on the flexible base substrate 011 on which the cathode is formed, reference may be made to FIG. 2. Optionally, the stress balancing layer 017 may be formed, by deposition, coating or sputtering, on the flexible base substrate 011 on which the cathode is formed.

Although the rigid base substrate is not shown in FIGS. 5 to 8, those skilled in the art can easily understand that in practice, the above steps 401 to 406 are usually completed on a rigid base substrate. After step 406 is performed, the flexible base substrate may be separated from the rigid base substrate to obtain the display substrate 01 as shown in FIG. 2.

In addition, in the manufacturing method of the display substrate according to the embodiment of the present disclosure, the involved one-time patterning process includes photoresist coating, exposure, development, etching, and photoresist stripping. Processing a material layer by the one-time patterning process to obtain the corresponding structure (such as processing the metal material layer to obtain a trace layer) may include: coating the material layer (such as the metal material layer) with a layer of photoresist to form a photoresist layer; and exposing the photoresist layer with a mask, such that a completely-exposed area and a non-exposed area are formed on the photoresist layer; and then adopting a developing process for processing, such that the photoresist in the completely-exposed area is completely removed, and all the photoresist in the non-exposed area is retained; etching a region, corresponding to the completely-exposed area, on the material layer (such as the metal material layer); and finally, stripping the photoresist in the non-exposed area, such that a corresponding structure (such as the trace layer) is obtained. Here, the description is given by taking the photoresist being a positive photoresist as an example. When the photoresist is a negative photoresist, reference may be made to the description in this paragraph for the process of the one-time patterning process, which is not repeated in the embodiment of the present disclosure here.

In addition, the sequence of steps for the manufacturing method of the display substrate according to the embodiments of the present disclosure may be adjusted appropriately, and the steps may also be added or subtracted according to the situation. Within the technical scope disclosed by the present disclosure, any variant which can be easily thought of by those skilled in the art shall be covered within the protection scope of the present disclosure, and therefore is not be repeated here.

In summary, the manufacturing method of the display substrate is provided in the embodiments of the present disclosure. In the flexible base substrate, the first adhesion-enhancing layer is formed between the trace layer and the first insulating layer, the first adhesion-enhancing layer is bonded to the trace layer and the first insulating layer respectively, and the orthographic projection of the first adhesion-enhancing layer on the flexible base substrate is at least within the bending area. The first adhesion-enhancing layer can enhance the adhesion between the trace layer and the first insulating layer, and reduce the possibility of breaking of the signal trace of the trace layer caused by separation of film layers between the trace layer and the first insulating layer, thereby reducing the probability of poor process of the display substrate. The trace layer may include the source and drain trace. The solution provided in the embodiments of the present application can prevent the source and drain trace from breaking, thereby reducing the probability of light lines along the extending direction of the source and drain trace appearing on the display substrate during display and improving the display effect of the display substrate.

An embodiment of the present disclosure also provides a display device which includes the display substrate 01 according to the aforementioned embodiment. The display substrate 01 according to the aforementioned embodiment is provided with a display surface (not marked in the figure) and a non-display surface (not marked in the figure) that are relatively arranged, and the display surface is provided with a bonding area. In the display device, the bonding area of the display substrate 01 is bent to the side where the non-display surface of the display substrate 01 is dispose. The display device may be a narrow frame display device, a frameless display device, or a full-screen display device. For example, the display device may be any product or component with a display function, such as a display panel, a wearable device such as a watch or a bracelet, a mobile terminal such as a mobile phone or a tablet computer, a television, a display, a notebook computer, a digital photo frame or a navigator.

Other embodiments of the present disclosure will be apparent to those skilled in the art after consideration of the specification and practice of the present disclosure. This present disclosure is intended to cover any variations, uses, or adaptations of the present disclosure following the general principles thereof and including common knowledge or commonly used technical measures which are not disclosed herein. The specification and embodiments are to be considered as exemplary only, and the true scope and spirit of the present disclosure are indicated by the claims.

It will be appreciated that the present disclosure is not limited to the exact construction that has been described above and illustrated in the accompanying drawings, and that various modifications and changes can be made without departing from the scope thereof. It is intended that the scope of the present disclosure is only limited by the appended claims.

What is claimed is:

1. A display substrate comprising: a flexible base substrate and a trace layer, a first adhesion-enhancing layer, and a first insulating layer that are stacked on the flexible base substrate, wherein
   the first adhesion-enhancing layer is between the first insulating layer and the trace layer, and the first adhesion-enhancing layer is bonded to the first insulating layer and the trace layer respectively;
   the flexible base substrate is provided with a bending area, and an overlapping area is present between an area which an orthographic projection of the first adhesion-enhancing layer on the flexible base substrate is within and the bending area; and
   the trace layer is provided with a signal trace, and an overlapping area is present between an area which an orthographic projection of the signal trace on the flexible base substrate is within and the bending area; and
   the display substrate further comprising a second adhesion-enhancing layer and a second insulating layer that are stacked on the flexible base substrate, wherein the second insulating layer is on one side of the trace layer distal from the first insulating layer, the second adhesion-enhancing layer is between the second insulating layer and the trace layer, the second adhesion-enhancing layer is bonded to the second insulating layer and the trace layer respectively, and an overlapping area is present between an area which an orthographic projection of the second adhesion-enhancing layer on the flexible base substrate is within and the bending area.

2. The display substrate according to claim 1, wherein a material of the first adhesion-enhancing layer comprises one or more of an acrylic resin, an epoxy resin, and a polyimide.

3. The display substrate according to claim 1, wherein a thickness of the first adhesion-enhancing layer is in a range of 1 micron to 3 microns.

4. The display substrate according to claim 1, wherein a material of the second adhesion-enhancing layer comprises one or more of an acrylic resin, an epoxy resin, and a polyimide.

5. The display substrate according to claim 1, wherein a thickness of the second adhesion-enhancing layer is in a range of 1 micron to 3 microns.

6. The display substrate according to claim 1, wherein the second insulating layer is on one side of the trace layer distal from the flexible base substrate; and
   the display substrate comprises a stress balancing layer on one side of the second insulating layer distal from the flexible base substrate, and an overlapping area is present between an area which an orthographic projection of the stress balancing layer on the flexible base substrate is within and the bending area.

7. The display substrate according to claim 1, wherein the trace layer comprises a source trace and a drain trace.

8. The display substrate according to claim 1, wherein the first insulating layer, the first adhesion-enhancing layer, and the trace layer are stacked along a direction away from the flexible base substrate.

9. The display substrate according to claim 1, wherein the first insulating layer is an organic layer.

10. The display substrate according to claim 1, wherein the second insulating layer is an organic layer.

11. The display substrate according to claim 1, wherein
    a material of the first adhesion-enhancing layer or a material of the second adhesion-enhancing layer comprises one or more of an acrylic resin, an epoxy resin, and a polyimide; and
    a thickness of the first adhesion-enhancing layer or a thickness of the second adhesion-enhancing layer is in a range of 1 micron to 3 microns.

12. A manufacturing method of a display substrate, wherein the method comprises:
    obtaining a flexible base substrate provided with a bending area;
    forming a trace layer, a first adhesion-enhancing layer, and a first insulating layer that are stacked on the flexible base substrate, wherein the first adhesion-enhancing layer is bonded to the first insulating layer and the trace layer respectively, an overlapping area is present between an area which an orthographic projection of the first adhesion-enhancing layer on the flexible base substrate is within and the bending area and an overlapping area is present between an area which an orthographic projection of the signal trace in the trace layer on the flexible base substrate is within and the bending area; and
    after forming the trace layer, the first adhesion-enhancing layer, and the first insulating layer that are stacked on the flexible base substrate, the method further comprises:

forming a second adhesion-enhancing layer and a second insulating layer that are stacked on the flexible base substrate on which the trace layer is formed, wherein the second adhesion-enhancing layer is bonded to the second insulating layer and the trace layer respectively, and an overlapping area is present between an area which an orthographic projection of the second adhesion-enhancing layer on the flexible base substrate is within and the bending area.

13. The method according to claim 12, wherein forming the trace layer, the first adhesion-enhancing layer, and the first insulating layer that are stacked on the flexible base substrate comprises:

forming the first insulating layer, the first adhesion-enhancing layer, and the trace layer in sequence on the flexible base substrate.

14. The method according to claim 13, wherein forming the first insulating layer, the first adhesion-enhancing layer, and the trace layer in sequence on the flexible base substrate comprises:

coating a polyimide solution on the flexible base substrate, and drying the polyimide solution to form the first insulating layer;
   forming, by one of deposition, coating and sputtering, an acrylic resin layer on the flexible base substrate on which the first insulating layer is formed;
   processing the acrylic resin layer by patterning to obtain the first adhesion-enhancing layer;
   forming, by one of deposition, coating and sputtering, a metal material layer on the flexible base substrate on which the first adhesion-enhancing layer is formed; and
   processing the metal material layer by patterning to obtain the trace layer.

15. The method according to claim 12, wherein after forming the second adhesion-enhancing layer and the second insulating layer that are stacked on the flexible base substrate on which the trace layer is formed, the method further comprises:

forming a stress balancing layer on the flexible base substrate on which the second insulating layer is formed, wherein an overlapping area is present between an area which an orthographic projection of the stress balancing layer on the flexible base substrate is within and the bending area.

16. The method according to claim 12, wherein obtaining the flexible base substrate provided with the bending area comprises:

providing a rigid base substrate; and
   forming the flexible base substrate provided with the bending area on the rigid base substrate.

17. A display device, comprising a display substrate, wherein the display substrate comprises:

a flexible base substrate and a trace layer, a first adhesion-enhancing layer, and a first insulating layer that are stacked on the flexible base substrate, wherein
   the first adhesion-enhancing layer is between the first insulating layer and the trace layer, and the first adhesion-enhancing layer is bonded to the first insulating layer and the trace layer respectively;
   the flexible base substrate is provided with a bending area, and an overlapping area is present between an area which an orthographic projection of the first adhesion-enhancing layer on the flexible base substrate is within and the bending area; and
   the trace layer is provided with a signal trace, and an overlapping area is present between an area which an orthographic projection of the signal trace on the flexible base substrate is within and the bending area; and
   wherein the display substrate further comprises a second adhesion-enhancing layer and a second insulating layer that are stacked on the flexible base substrate, wherein
   the second insulating layer is on one side of the trace layer distal from the first insulating layer, the second adhesion-enhancing layer is between the second insulating layer and the trace layer, the second adhesion-enhancing layer is bonded to the second insulating layer and the trace layer respectively, and an overlapping area is present between an area which an orthographic projection of the second adhesion-enhancing layer on the flexible base substrate is within and the bending area.

* * * * *